(12) United States Patent
Rebak et al.

(10) Patent No.: US 8,601,691 B2
(45) Date of Patent: *Dec. 10, 2013

(54) COMPONENT AND METHODS OF FABRICATING A COATED COMPONENT USING MULTIPLE TYPES OF FILLERS

(75) Inventors: Raul Basilio Rebak, Schenectady, NY (US); Renee Bushey Rohling, Burnt Hills, NY (US); Scott Andrew Weaver, Ballston Lake, NY (US); Ronald Scott Bunker, Waterford, NY (US); Don Mark Lipkin, Niskayuna, NY (US); John Brian McDermott, Rexford, NY (US); Lawrence Bernard Kool, Clifton Park, NY (US); Ann Melinda Ritter, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 140 days.

This patent is subject to a terminal disclaimer.

(21) Appl. No.: 13/095,129

(22) Filed: Apr. 27, 2011

(65) Prior Publication Data

US 2012/0276308 A1    Nov. 1, 2012

(51) Int. Cl.
*B21D 53/78* (2006.01)
*B05D 5/00* (2006.01)
*B05D 3/12* (2006.01)
*B05D 1/32* (2006.01)
*B26D 3/06* (2006.01)
*C25D 5/00* (2006.01)

(52) U.S. Cl.
USPC .......... 29/889.72; 29/889.721; 427/290; 427/282; 205/80

(58) Field of Classification Search
None
See application file for complete search history.

(56) References Cited

U.S. PATENT DOCUMENTS

| 5,626,462 | A | 5/1997 | Jackson et al. | |
|---|---|---|---|---|
| 5,640,767 | A | 6/1997 | Jackson et al. | |
| 5,875,549 | A | 3/1999 | McKinley | |
| 6,214,248 | B1 * | 4/2001 | Browning et al. | 216/56 |
| 6,234,755 | B1 | 5/2001 | Bunker et al. | |
| 6,254,756 | B1 * | 7/2001 | Maricocchi et al. | 205/97 |
| 6,321,449 | B2 | 11/2001 | Zhao et al. | |
| 6,368,060 | B1 | 4/2002 | Fehrenbach et al. | |
| 6,412,541 | B2 | 7/2002 | Roesler et al. | |
| 6,427,327 | B1 * | 8/2002 | Bunker | 29/889.1 |

(Continued)

FOREIGN PATENT DOCUMENTS

EP    1387040 B1    4/2004

OTHER PUBLICATIONS

Anderson et al., Response Surface Methods Simplified, p. 240.*

(Continued)

*Primary Examiner* — Timothy Meeks
*Assistant Examiner* — Ina Agaj
(74) *Attorney, Agent, or Firm* — Ann M. Agosti

(57) ABSTRACT

Methods of fabricating coated components using multiple types of fillers are provided. One method comprises forming one or more grooves in an outer surface of a substrate. Each groove has a base and extends at least partially along the outer surface of the substrate. The method further includes disposing a sacrificial filler within the groove(s), disposing a permanent filler over the sacrificial filler, disposing a coating over at least a portion of the substrate and over the permanent filler, and removing the first sacrificial filler from the groove(s), to define one or more channels for cooling the component. A component with a permanent filler is also provided.

21 Claims, 7 Drawing Sheets

(56) References Cited

U.S. PATENT DOCUMENTS

| | | | |
|---|---|---|---|
| 6,551,061 | B2 | 4/2003 | Darolia et al. |
| 6,582,194 | B1* | 6/2003 | Birkner et al. ............... 416/97 R |
| 6,602,053 | B2 | 8/2003 | Subramanian et al. |
| 6,617,003 | B1 | 9/2003 | Lee et al. |
| 6,905,302 | B2 | 6/2005 | Lee et al. |
| 6,921,014 | B2 | 7/2005 | Hasz et al. |
| 7,014,923 | B2 | 3/2006 | Schnell et al. |
| 7,094,475 | B2 | 8/2006 | Schnell et al. |
| 7,186,167 | B2 | 3/2007 | Joslin |
| 7,302,990 | B2 | 12/2007 | Bunker et al. |
| 7,744,348 | B2 | 6/2010 | Bezencon et al. |
| 7,772,314 | B2* | 8/2010 | Fernihough et al. ........... 524/492 |
| 2007/0253817 | A1* | 11/2007 | Bezencon et al. ........... 416/97 R |
| 2010/0080688 | A1 | 4/2010 | Bezencon et al. |

OTHER PUBLICATIONS

D.G. Hyams et al., "A Detailed Analysis of film Cooling Physics: Part III—Streamwise Injection With Shaped Holes," Journal of Turbomachinery, vol. 122, Issue 1, Jan. 2000, pp. 122-132.

B. Wei et al., "Curved Electrode and Electrochemical Machining Method and Assembly Employing the Same," U.S. Appl. No. 12/562,528, filed Sep. 18, 2009.

W. Zhang et al., Process and System for Forming Shaped Air Holes, U.S. Appl. No. 12/697,005, filed Jan. 29, 2010.

B.P. Lacy et al., "Hot Gas Path Component Cooling System," U.S. Appl. No. 12/765,372, filed Apr. 22, 2010.

B. Lacy et a., "Articles Which Include Chevron Film Cooling Holes, and Related Processes," U.S. Appl. No. 12/790,675, filed May 28, 2010.

J.E.J. Lambie et al., "An overview on micro-meso manufacturing techniques for micro-eat exchangers for turbine blade cooling," International Journal Manufacturing Research, vol. 3, No. 1, 2008, pp. 3-26.

R.S. Bunker et al., "Components With Re-Entrant Shaped Cooling Channels and Methods of Manufacture," U.S. Appl. No. 12/943,624, filed Nov. 10, 2010.

R.S. Bunker et al., "Component and Methods of Fabricating and Coating a Component," U.S. Appl. No. 12/943,646, filed Nov. 10, 2010.

R.S.Bunker et al., "Method of Fabricating a Component Using a Fugitive Coating," U.S. Appl. No. 12/943,563, filed Nov. 10, 2010.

R.S. Bunker et al., "Components With Cooling Channels and Methods of Manufacture," U.S. Appl. No. 12/965,083, filed Dec. 10, 2010.

R. S. Bunker et al "Method of Fabricating a Component Using a Two-Layer Structural Coating," U.S. Appl. No. 12/996,101, filed Dec. 13, 2010.

R.S. Bunker et al., "Turbine Components With Cooling Features and Methods of Manufacturing the Same," U.S. Appl. No. 12/953,177, filed Nov. 23, 2010.

R.S. Bunker, "Components With Cooling Channels and Methods of Manufacture," U.S. Appl. No. 13/026,595, filed Feb. 14, 2011.

R. Rebak et al., "Methods of Fabricating a Coated Component Using Multiple Types of Fillers," U.S. Appl. No. 13/083,701, filed Apr. 11, 2011.

R. Bunker et al., "Components with Cooling Channels Formed in Coating and Methods of Manufacture," U.S. Appl. No. 13/052,415, filed Mar. 21, 2011.

* cited by examiner

COMPONENT AND METHODS OF FABRICATING A COATED COMPONENT USING MULTIPLE TYPES OF FILLERS

BACKGROUND

The invention relates generally to gas turbine engines, and, more specifically, to micro-channel cooling therein.

In a gas turbine engine, air is pressurized in a compressor and mixed with fuel in a combustor for generating hot combustion gases. Energy is extracted from the gases in a high pressure turbine (HPT), which powers the compressor, and in a low pressure turbine (LPT), which powers a fan in a turbofan aircraft engine application, or powers an external shaft for marine and industrial applications.

Engine efficiency increases with temperature of combustion gases. However, the combustion gases heat the various components along their flowpath, which in turn requires cooling thereof to achieve a long engine lifetime. Typically, the hot gas path components are cooled by bleeding air from the compressor. This cooling process reduces engine efficiency, as the bled air is not used in the combustion process.

Gas turbine engine cooling art is mature and includes numerous patents for various aspects of cooling circuits and features in the various hot gas path components. For example, the combustor includes radially outer and inner liners, which require cooling during operation. Turbine nozzles include hollow vanes supported between outer and inner bands, which also require cooling. Turbine rotor blades are hollow and typically include cooling circuits therein, with the blades being surrounded by turbine shrouds, which also require cooling. The hot combustion gases are discharged through an exhaust which may also be lined, and suitably cooled.

In all of these exemplary gas turbine engine components, thin metal walls of high strength superalloy metals are typically used for enhanced durability while minimizing the need for cooling thereof. Various cooling circuits and features are tailored for these individual components in their corresponding environments in the engine. For example, a series of internal cooling passages, or serpentines, may be formed in a hot gas path component. A cooling fluid may be provided to the serpentines from a plenum, and the cooling fluid may flow through the passages, cooling the hot gas path component substrate and coatings. However, this cooling strategy typically results in comparatively low heat transfer rates and non-uniform component temperature profiles.

Micro-channel cooling has the potential to significantly reduce cooling requirements by placing the cooling as close as possible to the heated region, thus reducing the temperature difference between the hot side and cold side of the main load bearing substrate material for a given heat transfer rate. Currently, a sacrificial material is used to keep the structural coating from plugging the cooling channels during its application. Because cooling channels tend to have large ratios of length to hydraulic diameter, the filler removal process is typically time-consuming and hence expensive and further can be subject to incomplete removal of the filler.

It would therefore be desirable to provide methods for depositing a structural coating over cooling channels that overcome the above-noted shortcomings of current techniques.

BRIEF DESCRIPTION

One aspect of the present invention resides in a method of fabricating a component. The method includes forming one or more grooves in an outer surface of a substrate. Each groove has a base and extends at least partially along the outer surface of the substrate. The method further includes disposing a sacrificial filler within the groove(s), disposing a permanent filler over the sacrificial filler, and disposing a coating over at least a portion of the substrate and over the permanent filler. The method further includes removing the first sacrificial filler from the groove(s), to define one or more channels for cooling the component.

Another aspect of the present invention resides in a component that includes a substrate comprising an outer surface and an inner surface. The outer surface defines one or more grooves, and each groove extends at least partially along the outer surface of the substrate and has a base. The component further includes a permanent filler disposed within and extending across a top of each groove. The component further includes a coating disposed over at least a portion of the substrate and over the permanent filler. The groove(s) and the permanent filler or coating together define one or more channels for cooling the component.

Yet another aspect of the present invention resides in a method of fabricating a component. The method includes forming one or more grooves in an outer surface of a substrate. Each groove has a base and a top and extends at least partially along the outer surface of the substrate. The method further includes disposing a filler within the groove(s), such that a gap is formed between the filler and the base of the respective groove, and disposing a coating over at least a portion of the substrate and over the filler.

Another aspect of the present invention resides in a method of fabricating a component. The method includes forming one or more grooves in an outer surface of a substrate. Each grooves has a base and extends at least partially along the outer surface of the substrate. The method further includes disposing a sacrificial filler within the groove(s), disposing a second filler over the sacrificial filler and over at least a portion of the outer surface of the substrate, and disposing a coating over the second filler, such that the coating extends above at least a portion of the substrate. The method further includes removing the first sacrificial filler from the groove(s) and partially removing the second filler, to define one or more channels for cooling the component.

DRAWINGS

These and other features, aspects, and advantages of the present invention will become better understood when the following detailed description is read with reference to the accompanying drawings in which like characters represent like parts throughout the drawings, wherein.

Figure 9:
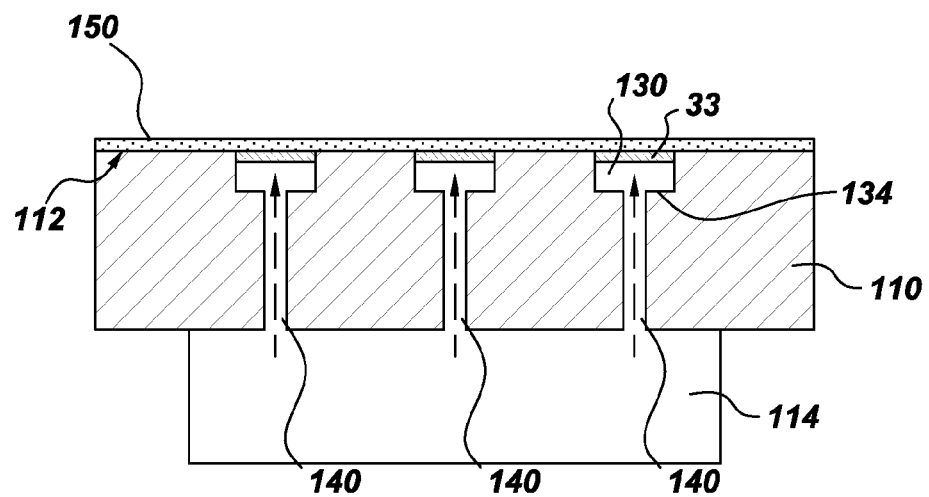
Figure 10:
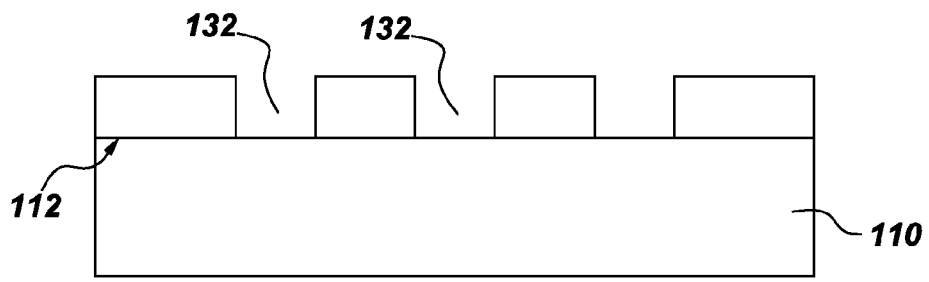
Figure 11:
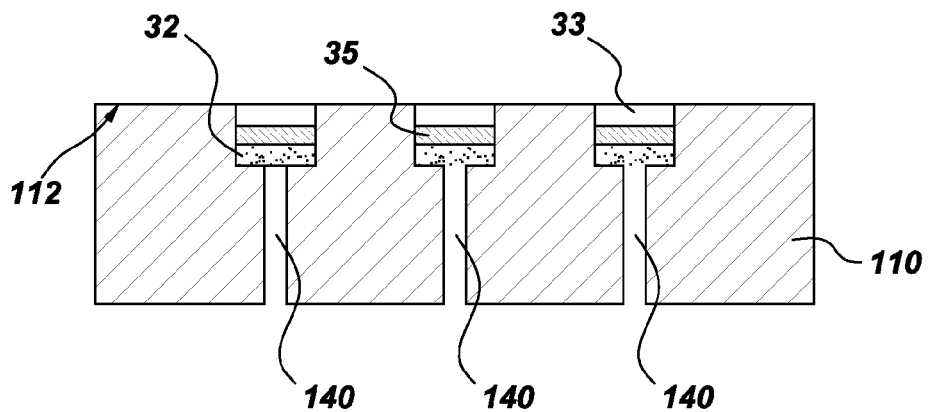
Figure 12:
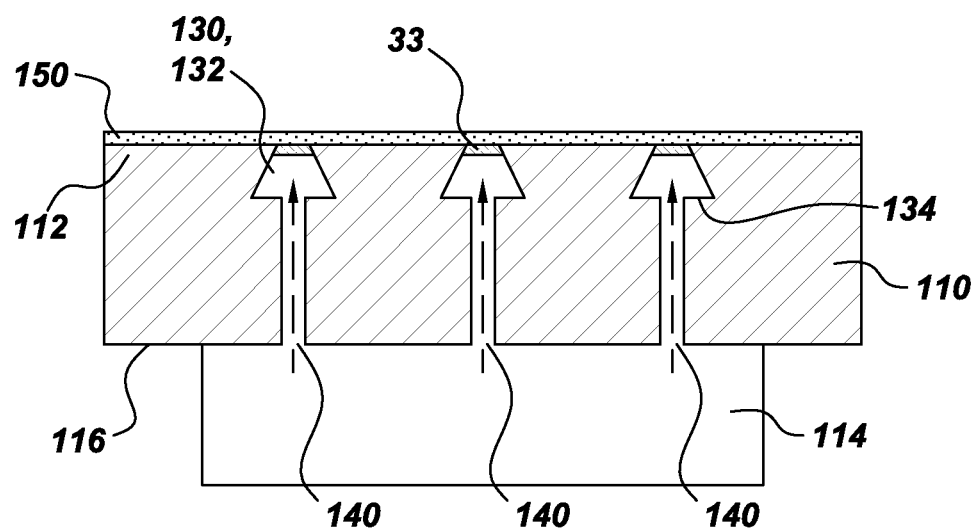
Figure 13:
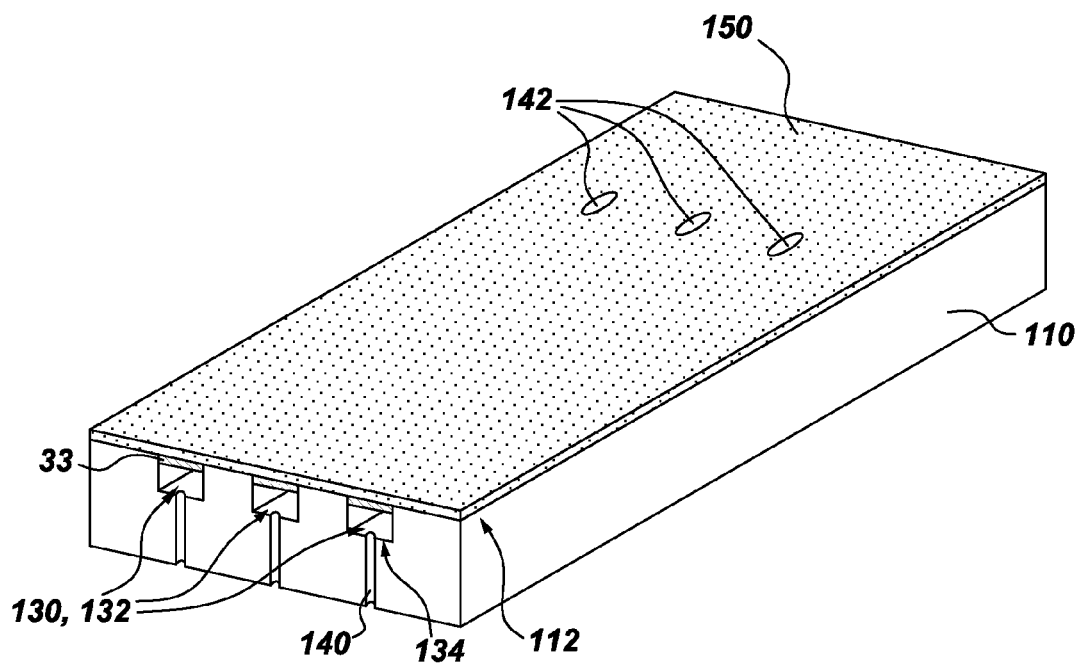
Figure 14:
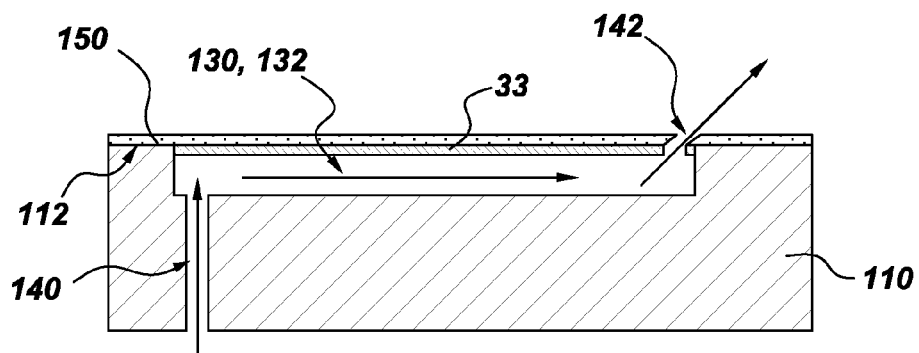
Figure 15:
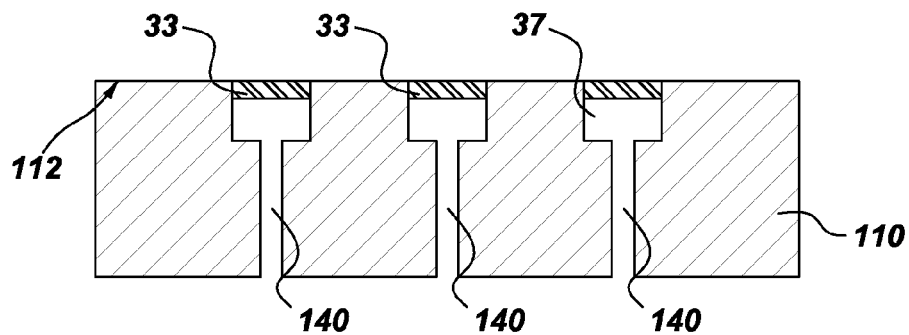
Figure 16:
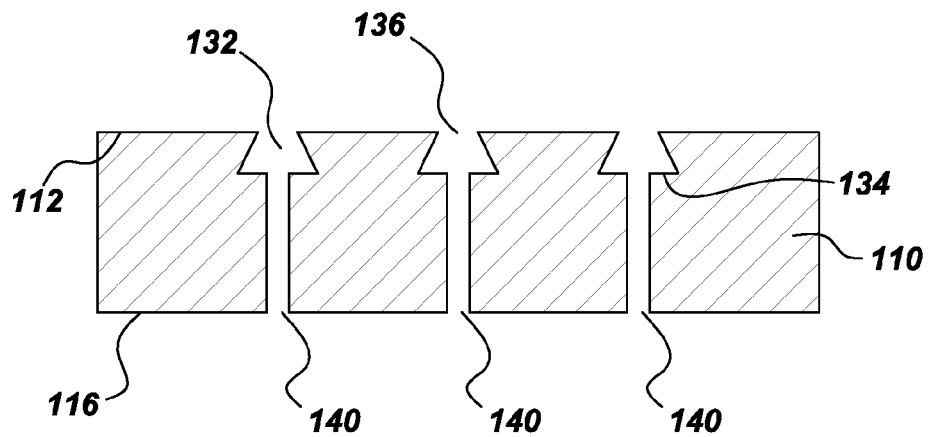
Figure 17:
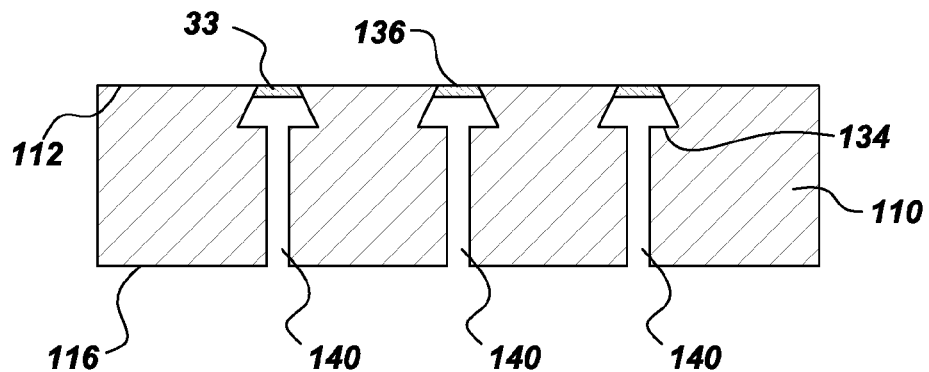
Figure 18:
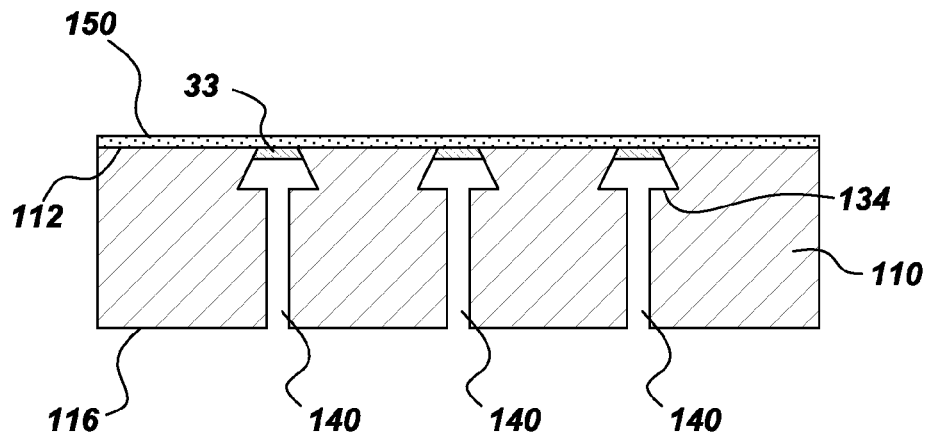

FIGS. 3-8 schematically illustrate process steps for applying a coating to a substrate using multiple fillers;

FIG. 9 schematically depicts, in cross-sectional view, three example cooling channels with a permanent filler layer remaining in the cooling channels;

FIG. 10 illustrates another technique for forming grooves by adding material on the outer surface of the substrate on either side of the desired grooves;

FIG. 11 schematically illustrates a process step using three fillers;

FIG. 12 schematically illustrates a coated component with re-entrant shaped cooling channels and a permanent filler;

FIG. 13 schematically depicts, in perspective view, three example cooling channels with a permanent filler, where the channels extend partially along the surface of the substrate and channel coolant to respective film cooling holes; and FIG. 14 is a cross-sectional view of one of the example cooling channels of FIG. 12 and shows the channel conveying coolant from an access hole to a film cooling hole;

FIG. 15 schematically illustrates a process step for applying a coating to a substrate using a filler with a gap formed between the filler and the base of the respective grooves; and FIG. 16-18 schematically illustrate process steps for applying a coating to a substrate with re-entrant shaped grooves using a permanent filler.

DETAILED DESCRIPTION

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity). In addition, the term "combination" is inclusive of blends, mixtures, alloys, reaction products, and the like.

Moreover, in this specification, the suffix "(s)" is usually intended to include both the singular and the plural of the term that it modifies, thereby including one or more of that term (e.g., "the passage hole" may include one or more passage holes, unless otherwise specified). Reference throughout the specification to "one embodiment," "another embodiment," "an embodiment," and so forth, means that a particular element (e.g., feature, structure, and/or characteristic) described in connection with the embodiment is included in at least one embodiment described herein, and may or may not be present in other embodiments. In addition, it is to be understood that the described inventive features may be combined in any suitable manner in the various embodiments.

Figure 1:
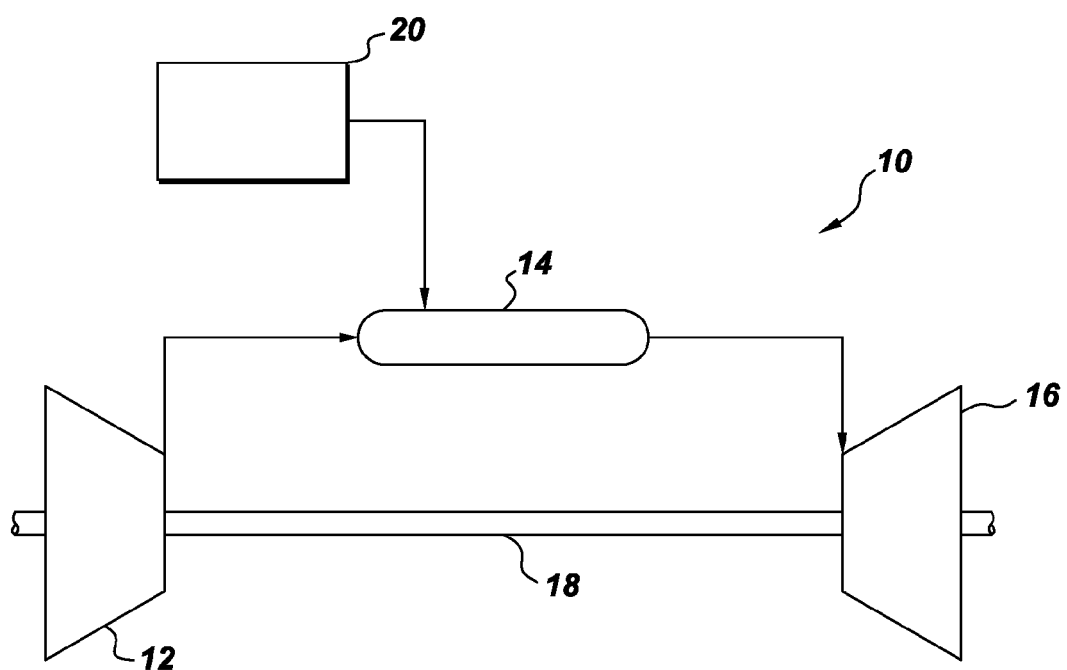
FIG. 1 is a schematic illustration of a gas turbine system.

FIG. 1 is a schematic diagram of a gas turbine system 10. The system 10 may include one or more compressors 12, combustors 14, turbines 16, and fuel nozzles 20. The compressor 12 and turbine 16 may be coupled by one or more shaft 18. The shaft 18 may be a single shaft or multiple shaft segments coupled together to form shaft 18.

The gas turbine system 10 may include a number of hot gas path components 100. A hot gas path component is any component of the system 10 that is at least partially exposed to a high temperature flow of gas through the system 10. For example, bucket assemblies (also known as blades or blade assemblies), nozzle assemblies (also known as vanes or vane assemblies), shroud assemblies, transition pieces, retaining rings, and compressor exhaust components are all hot gas path components. However, it should be understood that the hot gas path component 100 of the present invention is not limited to the above examples, but may be any component that is at least partially exposed to a high temperature flow of gas. Further, it should be understood that the hot gas path component 100 of the present disclosure is not limited to components in gas turbine systems 10, but may be any piece of machinery or component thereof that may be exposed to high temperature flows.

When a hot gas path component 100 is exposed to a hot gas flow, the hot gas path component 100 is heated by the hot gas flow and may reach a temperature at which the hot gas path component 100 fails. Thus, in order to allow system 10 to operate with hot gas flow at a high temperature, increasing the efficiency and performance of the system 10, a cooling system for the hot gas path component 100 is required.

In general, the cooling system of the present disclosure includes a series of small channels, or micro-channels, formed in the surface of the hot gas path component 100. For industrial sized power generating turbine components, "small" or "micro" channel dimensions would encompass approximate depths and widths in the range of 0.25 mm to 1.5 mm, while for aviation sized turbine components channel dimensions would encompass approximate depths and widths in the range of 0.15 mm to 0.5 mm. The hot gas path component may be provided with a cover layer. A cooling fluid may be provided to the channels from a plenum, and the cooling fluid may flow through the channels, cooling the cover layer.

Figure 2:
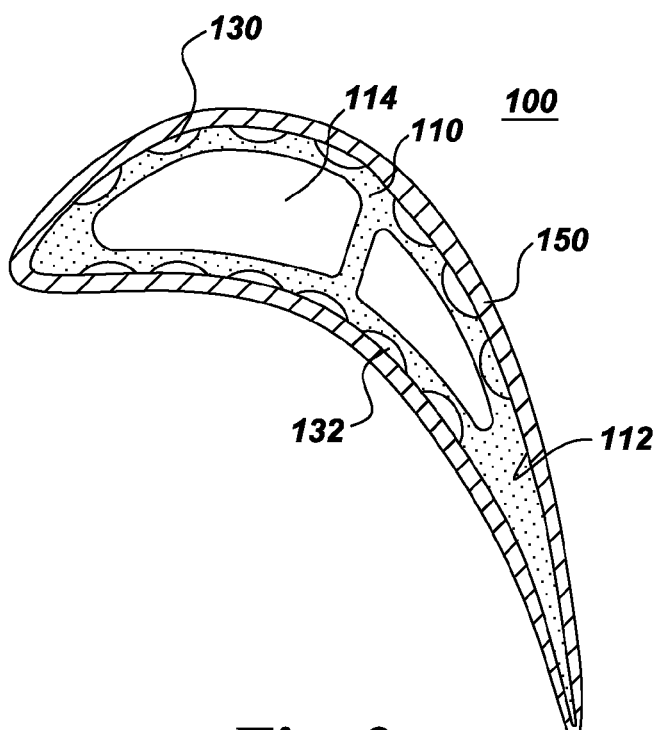
FIG. 2 is a schematic cross-section of an example airfoil configuration with cooling channels, in accordance with aspects of the present invention.
Figure 3:
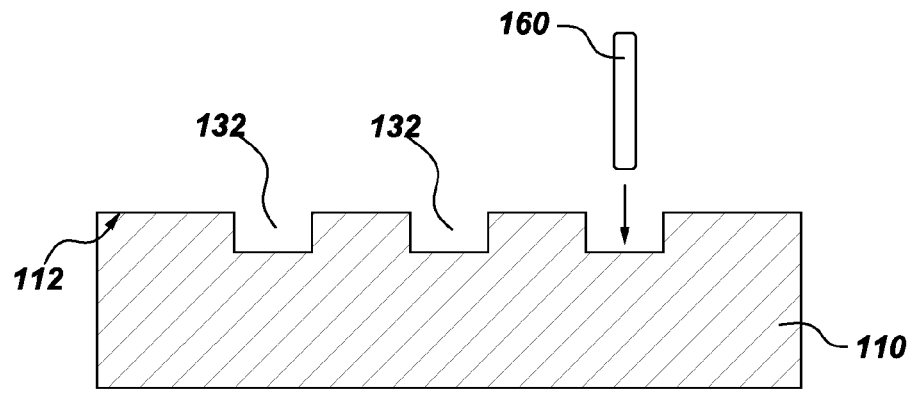

A method of fabricating a component 100 is described with reference to FIGS. 2-14. As indicated, for example in FIGS. 3 and 10, the component fabrication method includes forming one or more grooves 132 in an outer surface 112 of a substrate 110. As indicated in FIGS. 13 and 14, for example, each groove 132 has a base 134 and extends at least partially along the outer surface 112 of the substrate 110. The grooves 132 may be formed either by removing material from the substrate 110, as indicated in FIG. 3 or by adding material to the substrate 110 on either side of the desired grooves, as indicated in FIG. 10. U.S. Pat. No. 6,921,014, Hasz et al., "Method for forming a channel on the surface of a metal substrate," describes techniques for forming grooves by adding material to the substrate 110 and is incorporated by reference herein in its entirety. For the example arrangement shown in FIG. 2, the substrate 110 has at least one hollow interior space 114.

The substrate 110 is typically cast prior to forming grooves 132 in the outer surface 112 of the substrate 110. As discussed in commonly assigned U.S. Pat. No. 5,626,462, Melvin R. Jackson et al., "Double-Wall Airfoil," which is incorporated by reference herein in its entirety, substrate 110 may be formed from any suitable material. Depending on the intended application for component 100, this could include Ni-base, Co-base and Fe-base superalloys. The Ni-base superalloys may be those containing both γ and γ' phases, particularly those Ni-base superalloys containing both γ and γ' phases wherein the γ' phase occupies at least 40% by volume of the superalloy. Such alloys are known to be advantageous because of a combination of desirable properties including high temperature strength and high temperature creep resistance. The substrate material may also comprise a NiAl intermetallic alloy, as these alloys are also known to possess a combination of superior properties including high temperature strength and high temperature creep resistance that are advantageous for use in turbine engine applications used for aircraft. In the case of Nb-base alloys, coated Nb-base alloys having superior oxidation resistance will be preferred, particularly those alloys comprising Nb-(27-40)Ti-(4.5-10.5)Al-(4.5-7.9)Cr-(1.5-5.5)Hf-(0-6)V, where the composition ranges are in atom per cent. The substrate material may also comprise a Nb-base alloy that contains at least one secondary phase, such as a Nb-containing intermetallic compound comprising a silicide, carbide or boride. Such alloys are composites of a ductile phase (i.e., the Nb-base alloy) and a strengthening phase (i.e., a Nb-containing intermetallic compound). For other arrangements, the substrate material comprises a molybdenum based alloy, such as alloys based on molybdenum (solid solution) with $Mo_5SiB_2$ and $Mo_3Si$ second phases. For other configurations, the substrate material comprises a ceramic matrix composite, such as a silicon carbide (SiC) matrix reinforced with SiC fibers. For other configurations the substrate material comprises a TiAl-based intermetallic compound.

Figure 5:
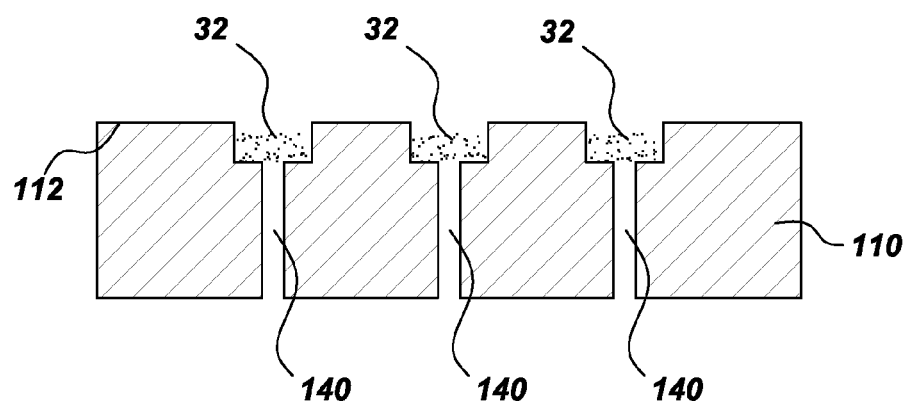
Figure 6:
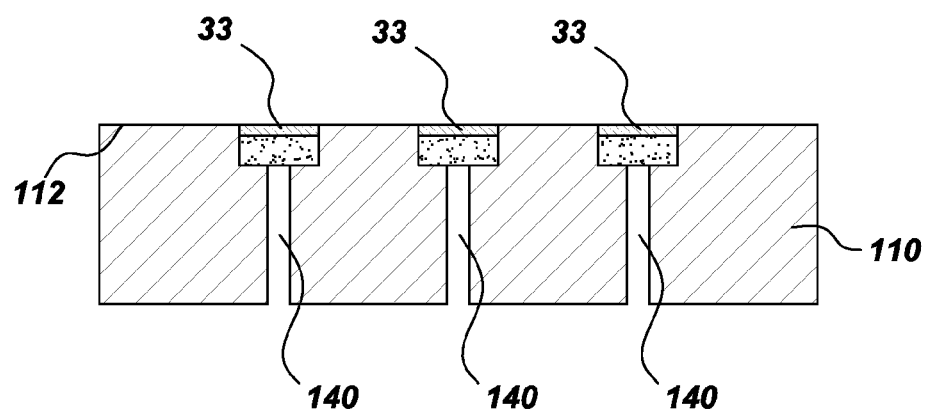
Figure 7:
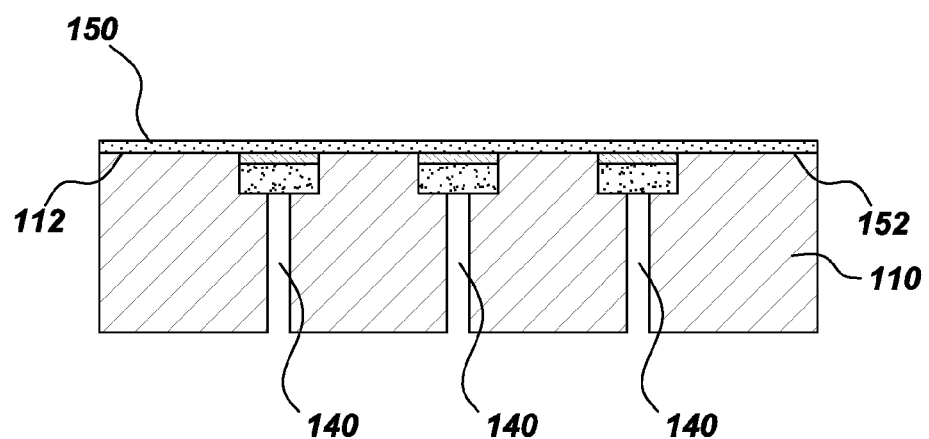
Figure 8:
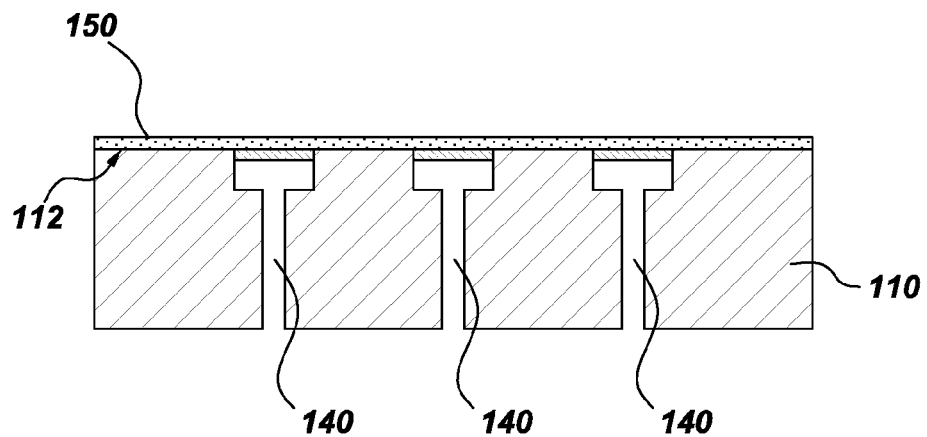

As indicated, for example, in FIGS. 5 and 6, the component fabrication method further includes disposing a sacrificial filler 32 within the groove(s) 132 and depositing a permanent filler 33 over the sacrificial filler 32. The permanent filler 33 may be disposed within the groove(s) 132 or may extend over at least a portion of the outer surface 112 of the substrate 110. Suitable materials for fillers 32, 33 are provided below. It should be noted that although the interface between the sacrificial and permanent fillers is shown as being smooth in FIGS. 6 and 7, in practice this interface may be rough and/or may include voids. As indicated in FIGS. 7-9, for example, the component fabrication method further includes disposing a coating 150 over at least a portion of the substrate 110 and over the permanent filler 33 and removing the sacrificial filler 32 from the groove(s) 132, such that the groove(s) 132 and the permanent filler 33 (or coating 150 if the permanent filler 33 forms an integral part of the coating, as discussed below) together define one or more channels 130 for cooling the component 100. Suitable materials for coating 150 are provided below. Although the grooves are shown as having straight walls, the grooves 132 can have any configuration, for example, they may be straight, curved, or have multiple curves.

As indicated in FIGS. 13 and 14, for example, the substrate 110 and the coating 150 may further define one or more exit film holes 142. For particular processes, the film holes 142 may be formed, for example by drilling, prior to removal of the fillers 32, 33. Beneficially, the fillers may act as backstops to the drilling of the holes. For the example configuration shown in FIGS. 13 and 14, the cooling channel 130 conveys coolant from the respective access hole 140 to the exiting film cooling hole 142. However, other configurations do not entail a film hole, with the cooling channels simply extending along the substrate surface 112 and exiting off an edge of the component, such as the trailing edge or the bucket tip, or an endwall edge. In addition, it should be noted that although the film holes are shown in FIG. 13 as being round, this is a non-limiting example. The film holes may also be non-circular shaped holes.

Coating 150 comprises a suitable material and is bonded to the airfoil-shaped outer surface 112 of substrate 110 and/or to the permanent filler 33 if the permanent filler extends over at least a portion of the outer surface 112 of substrate 110. For particular configurations, the coating 150 has a thickness in the range of 0.1-2.0 millimeters, and more particularly, in the range of 0.1 to 1 millimeter, and still more particularly 0.1 to 0.5 millimeters for industrial components. For aviation components, this range is typically 0.1 to 0.25 millimeters. However, other thicknesses may be utilised depending on the requirements for a particular component 100.

The coating 150 comprises structural coating layers and may further include optional additional coating layer(s). The coating layer(s) may be deposited using a variety of techniques. For particular processes, the structural coating layer(s) are deposited by performing an ion plasma deposition (cathodic arc). Example ion plasma deposition apparatus and method are provided in commonly assigned, US Published Patent Application No. 20080138529, Weaver et al, "Method and apparatus for cathodic arc ion plasma deposition," which is incorporated by reference herein in its entirety. Briefly, ion plasma deposition comprises placing a cathode formed of a coating material into a vacuum environment within a vacuum chamber, providing a substrate 110 within the vacuum environment, supplying a current to the cathode to form a cathodic arc upon a cathode surface resulting in arc-induced erosion of coating material from the cathode surface, and depositing the coating material from the cathode upon the substrate surface 112.

Non-limiting examples of a coating deposited using ion plasma deposition include structural coatings, as well as bond coatings and oxidation-resistant coatings, as discussed in greater detail below with reference to U.S. Pat. No. 5,626,462. For certain hot gas path components 100, the structural coating comprises a nickel-based or cobalt-based alloy, and more particularly comprises a superalloy or a (NiCo)CrAlY alloy. For example, where the substrate material is a Ni-base superalloy containing both γ and γ' phases, structural coating may comprise similar compositions of materials, as discussed in greater detail below with reference to U.S. Pat. No. 5,626,462.

For other process configurations, the structural coating is deposited by performing at least one of a thermal spray process and a cold spray process. For example, the thermal spray process may comprise combustion spraying or plasma spraying, the combustion spraying may comprise high velocity oxygen fuel spraying (HVOF) or high velocity air fuel spraying (HVAF), and the plasma spraying may comprise atmospheric (such as air or inert gas) plasma spray, or low pressure plasma spray (LPPS, which is also know as vacuum plasma spray or VPS). In one non-limiting example, a NiCrAlY coating is deposited by HVOF or HVAF. Other example techniques for depositing the structural coating include, without limitation, sputtering, electron beam physical vapor deposition, electroless plating, and electroplating.

For certain configurations, it is desirable to employ multiple deposition techniques for depositing structural and optional additional coating layers. For example, a first structural coating layer may be deposited using an ion plasma deposition, and a subsequently deposited layer and optional additional layers (not shown) may be deposited using other techniques, such as a combustion spray process or a plasma spray process. Depending on the materials used, the use of different deposition techniques for the coating layers may provide benefits in properties, such as, but not restricted to strain tolerance, strength, adhesion, and/or ductility.

The grooves 132 may be formed using a variety of techniques. For example, the grooves 132 may be formed using one or more of an abrasive liquid jet, plunge electrochemical machining (ECM), electric discharge machining with a spinning single point electrode (milling EDM), and laser machining (laser drilling). Example laser machining techniques are described in commonly assigned, U.S. patent application Ser. No. 12/697,005, "Process and system for forming shaped air holes" filed Jan. 29, 2010, which is incorporated by reference herein in its entirety. Example EDM techniques are described in commonly assigned U.S. patent application Ser. No. 12/790,675, "Articles which include chevron film cooling holes, and related processes," filed May 28, 2010, which is incorporated by reference herein in its entirety.

For particular process configurations, the grooves 132 are formed by directing an abrasive liquid jet 160 at the outer surface 112 of the substrate 110, as schematically depicted in FIG. 3. Example water jet drilling processes and systems are provided in U.S. patent application Ser. No. 12/790,675. As explained in U.S. patent application Ser. No. 12/790,675, the water jet process typically utilizes a high-velocity stream of abrasive particles (e.g., abrasive "grit"), suspended in a stream of high pressure water. The pressure of the water may vary considerably, but is often in the range of about 35-620 MPa. A number of abrasive materials can be used, such as garnet, aluminum oxide, silicon carbide, and glass beads.

In addition, and as explained in U.S. patent application Ser. No. 12/790,675, the water jet system can include a multi-axis computer numerically controlled (CNC) unit. The CNC systems themselves are known in the art, and described, for example, in U.S. Patent Publication 2005/0013926 (S. Rutkowski et al), which is incorporated herein by reference. CNC systems allow movement of the cutting tool along a number of X, Y, and Z axes, as well as rotational axes.

Figure 4:
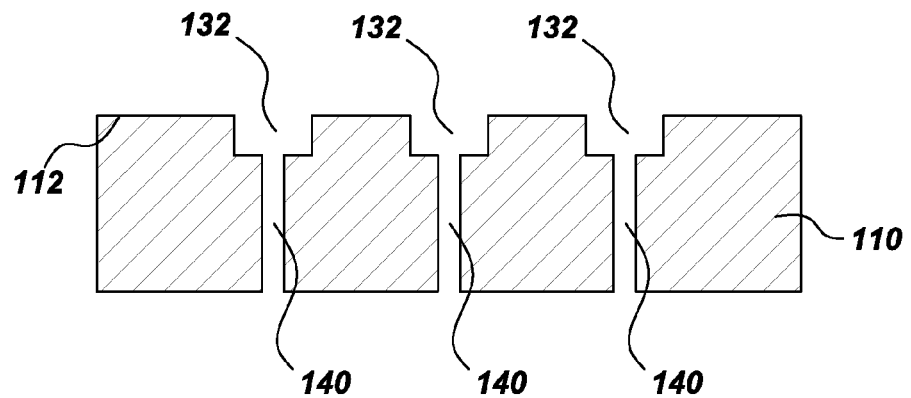

For the example process shown in FIG. 4, the component fabrication method further includes forming one or more access holes 140 through the base 134 of a respective one of the grooves 132 to provide fluid communication between the grooves 132 and the hollow interior space(s) 114. The access holes 140 are typically formed prior to depositing the sacrificial filler 32. However, for certain processes, the access holes may be formed after depositing the sacrificial filler, namely by drilling through the sacrificial filler as well as the substrate. The access holes 140 are typically circular or oval in cross-section and may be formed, for example using on or more of laser machining (laser drilling), abrasive liquid jet, electric discharge machining (EDM) and electron beam drilling. The access holes 140 may be normal to the base 134 of the respective grooves 132 (as shown in FIG. 13, for example) or, more generally, may be drilled at angles in a range of 20-90 degrees relative to the base 134 of the groove. The access holes 140 may be used to leach the sacrificial filler 32 from the channels after the coating 150 has been deposited.

For the example shown in FIGS. 8 and 9, the sacrificial filler 32 is removed from the groove(s) 132, such that the groove(s) 132 and the second filler 33 together define one or more channels 130 for cooling the component 100. Namely, for particular processes, the permanent filler 33 forms a permanent layer 33 (either within the groove(s) or extending at least partially across the outer surface 112 of substrate 110) that is not removed from the channels 130, such that the groove(s) 132 and the permanent filler 33 (and/or coating 150) together define the cooling channel(s) 130, as shown in FIG. 9, for example. Depending on the application, a variety of materials may be used for the first and second fillers 32, 33. Referring now to FIG. 5, for particular arrangements, the sacrificial filler 32 comprises at least one material selected from the group consisting of wax, resin, metal alloy, graphite and combinations thereof. Non-limiting examples of suitable resins, include epoxy and photo-curable resins (for example, visible or UV curable resins), non-limiting examples of which include a UV/visible light curable masking resin, marketed under the trademark Speedmask 729® by DYMAX, having a place of business in Torrington, Conn. If a resin is used, the method further includes the optional step of curing the resin prior to depositing the permanent filler 33. Non-limiting example metal alloys include metal alloys with low melting temperatures (for example less than about 300° C.), such as solders, for example lead bismuth, tin lead, lead tin bismuth, and indium lead solders.

For more particular arrangements, the sacrificial filler 32 comprises wax or resin and further comprises an electrically conductive particulate phase, such as powders, flakes, and whiskers, dispersed within the wax or resin. By using an electrically conductive sacrificial filler 32, the permanent filler 33 may be deposited by electroplating or ion plasma deposition. For example, the wax or resin base may be loaded with a graphite or aluminum powder, so that the permanent filler 33 can be electroplated over the first sacrificial filler.

For particular configurations, the permanent filler 33 comprises at least one metal. For example, the permanent filler 33 may comprises at least one of tungsten, nickel, cobalt, molybdenum, chromium, aluminum, and alloys thereof. The metal may be deposited using a metal ink, a solid metal filler, by electroplating or by electroless deposition. Non-limiting examples of deposition techniques for the metal layer 33 include using a syringe or direct write technique to deposit a metal ink, for example molybdenum or tungsten ink particles dispersed in a resin binder. For example, tungsten and/or molybdenum may be deposited in the form of a metal ink using a syringe or direct write, in which case the method further includes the additional optional step of curing the metal ink prior to depositing the coating 150.

For other processes, a solid metal filler may be used, for example an annealed metal wire, as described in commonly assigned U.S. patent Ser. No. 12/953,177, Ronald S. Bunker et al. "Turbine components with cooling features and methods of manufacturing the same." For other processes, a thin layer (foil) of tungsten or molybdenum is pressed into the groove(s) 132 on top of the sacrificial filler 32.

For other processes, a metal layer 33 may be deposited by electroplating or by electroless deposition. For example, molybdenum may be deposited using an electroless technique. For certain processes, molybdenum may be deposited by physical vapor deposition, for example by sputtering, evaporation, and ion plasma deposition. For other processes, nickel is deposited, for example by electroless plating, into the grooves and then left in the channels.

A variety of techniques may be employed to remove the sacrificial filler 32 depending on the specific filler materials used. For certain configurations, the sacrificial filler 32 may be readily removable, for example by melting, evaporating, pyrolizing, or oxidizing the sacrificial filler 32 out of the groove(s) 132. For example, a wax layer 32 may be removed by heating (for example, at about 100° C.) or by being burned out (vaporized) at about 300° C. In addition, where residue remains after performing an initial removal process, the residue may be removed by pyrolysis.

For particular processes, the majority of the groove is filled with a readily removable sacrificial filler 32 and a relatively small amount of the permanent filler 33 is used. This facilitates the use of a second filler 33 that can withstand polishing (for example, grit blast) or other operations performed prior to coating, as well as withstanding the coating process itself. For particular configurations, the sacrificial filler 32 is deposited within the groove(s) 132 to a partial fill in a range of about 60-99.9 percent of the depth of the respective groove 132, and the permanent filler 33 is then deposited within the groove(s) 132 to at least a full fill of the respective groove 132. If the grooves are overfilled with the second material 33, the excess material may be removed, for example by application of a doctor blade or by polishing depending on the type of filler 33 used, prior to deposition of the coating 150.

For particular configurations, the thickness of the permanent filler 33 is less than about 500 microns. More particularly, the thickness of the permanent layer 33 is less than about 200 microns, and still more particularly, is less than about 50 microns. Beneficially, by depositing a relatively thick layer of the sacrificial filler 32, which is relatively easy to remove but less robust to the coating process, with a relatively thin layer of the second, permanent filler 33, the resulting filler will be able to withstand the coating process with the bulk of the filler (namely, the sacrificial filler 32) being easily removed from the groove to leave a cooling channel defined by the groove 132 and the permanent filler 33.

For the example arrangement shown in FIG. 11, the component fabrication method further includes disposing at least one additional filler 35 within the one or more grooves 132 before disposing the permanent filler 33. For particular processes, the sacrificial filler 32 comprises wax, the additional filler 35 comprises electroplated copper and the permanent filler 33 comprises sputtered molybdenum. For this example, the sacrificial filler 32 may be removed by heating and the additional filler 35 may be removed using concentrated nitric acid. For other example processes, the sacrificial filler 32 comprises copper wire, the additional filler 35 comprises a resin, and the permanent filler 33 comprises tungsten.

In addition, the method may further optionally include the application of an oxidation coating, such as PtAl (for example for aviation components) or an MCrAlY coating, where M is selected from cobalt, nickel, or iron (for example, for stationary power generation components), to the interior surfaces of the cooling channels 130. For particular processes, the oxidation coating (not shown) may be applied after the fillers 32, 35 have been removed and prior to performing an optional heat treatment.

For particular processes, the permanent filler 33 comprises an electrically conductive material 33, and the step of disposing the permanent filler 33 comprises at least partially covering the sacrificial filler 32 with an electrically conductive material 33. For this process, the coating 150 may be deposited using an ion plasma or by electroplating. Ion plasma deposition is described above. More particularly, the electrically conductive material 33 may comprise an electrically conductive particulate phase 33, such as powders, flakes, and whiskers. For particular processes, the electrically conductive particulate phase is sprinkled over the sacrificial filler 32 with a surface area coverage of at least about thirty percent, and more particularly, of at least about fifty percent. For particular processes, the electrically conductive particulate phase 33 is sprinkled over the sacrificial filler 32 with a surface area coverage of at least about thirty percent, more particularly, of at least about fifty percent, and still more particularly about one hundred percent.

A number of materials can be used for the electrically conductive particulate phase 33 depending on the substrate and coating composition. For example nickel or molybdenum particulate phase may be used. For example processes, the sacrificial filler 32 applied in the grooves 132 is wet, such that the electrically conductive particulate phase 33 sticks to the wet sacrificial filler 32. The electrically conductive particulate phase improves the coating coverage from an ion plasma coating process by allowing for high energy metallic ions to adhere to the conductive particulate phase. Once an initial consistent layer is generated, the subsequent ions from the cathode build up on this metallic layer and thicken it. For this process, the conductive particulate phase 33 may take the form of plurality of metal particles integrally connected to a surface 152 of the coating 150, rather than forming a continuous permanent layer.

A number of sacrificial fillers 32 may be used with in this process. Desirably, the sacrificial filler will have minimal shrinkage at the relevant coating deposition temperatures and will withstand temperatures of less than about 550° C., for example. One example class of suitable filler 32 materials includes commercially available low shrinkage joint compounds. Beneficially, these materials may be removed after the coating deposition by mechanical agitation and application of hot water. In one non-limiting example, a joint compound marketed under the tradename Durabond-90®, which is commercially availably from US Gypsum, was used as a sacrificial filler, and nickel powder was sprinkled over the wet joint compound to a coverage of about 100%. A nickel based coating 150 was deposited by ion plasma deposition, and the joint compound was then removed by mechanical agitation and application of hot water.

In addition to being deposited over a sacrificial filler 32, an electrically conductive particulate phase 33 may be scattered over an additional filler 35, such that the coating 150 can be deposited using an ion plasma over an electrically non-conducting additional filler 35.

Although, the process described above with reference to FIGS. 3-9 is shown as having rectangular grooves 132, the grooves may have a variety of shapes depending on the requirements of the specific application. For example, the grooves 132 (and channels 130) may be re-entrant grooves 132 (re-entrant channels 130), as described below with reference to FIG. 12. In addition, the side-walls of the grooves 132 (channels 130) need not be straight. For various applications, the side-walls of the grooves 132 (channels 130) may be curved or rounded.

For the example configuration shown in FIG. 12, the base 134 of each respective groove 132 is wider than the top 136 thereof, such that each groove 132 comprises a re-entrant shaped groove 132. Re-entrant grooves 132 are discussed in commonly assigned, U.S. patent application Ser. No. 12/943,624, Bunker et al., "Components with re-entrant shaped cooling channels and methods of manufacture," which is incorporated by reference herein in its entirety. Beneficially, by filling re-entrant shaped grooves 132 with a more readily removable sacrificial filler that is covered with a second permanent filler 33 (FIG. 12), the coating will bridge the top 136 of the groove, and the sacrificial filler 32 will be relatively easy to remove.

For particular configurations, the base 134 of a respective one of the re-entrant shaped grooves 132 is at least 2 times wider than the top 136 of the respective groove 132. For example, if the base 134 of the groove 132 is 0.75 millimeters, the top 136 would be less than 0.375 millimeters in width, for this configuration. For more particular configurations, the base 134 of the respective re-entrant shaped groove 132 is at least 3 times wider than the top 136 of the respective groove 132, and still more particularly, the base 134 of the respective re-entrant shaped groove 132 is in a range of about 3-4 times wider than the top 136 of the respective groove 132. Beneficially, a large base to top ratio increases the overall cooling volume for the micro-channel 130.

As discussed in U.S. patent application Ser. No. 12/943,624, with reference to FIGS. 7 and 11 of U.S. Ser. No. 12/943,624, for certain configurations, the coating 150 completely bridges the respective grooves 132, such that the coating 150 seals the respective cooling channels 130. For other arrangements, the permanent filler may comprise a plurality of metal particles integrally connected to a surface 152 (indicated in FIG. 7) of the coating 150 (instead of forming a continuous permanent layer 33) and the coating 150 may define one or more porous gaps (also termed "permeable slots"), for example, porosity in the coating 150 or a gap in the coating, such that the coating 150 does not completely bridge each of the respective grooves 132. Although the methods taught in U.S. patent application Ser. No. 12/943,624 deposit a coating without the use of fillers, re-entrant shaped grooves may also be advantageously coated using the multiple fillers of the process shown in FIGS. 3-9 of the present application. For example, the fillers may be used to make sure that the coating bridges the top of the groove, with only a relatively simple removal process needed for the readily removable sacrificial filler 32 (and optionally additional filler 35).

A component 100 embodiment of the invention is described with reference to FIGS. 3, 9, 10, 13, 14, and 16. As indicated, for example, in FIG. 9, the component 100 includes a substrate 110 comprising an outer surface 112 and an inner surface 116. The outer surface 112 defines one or more grooves 132, as indicated in FIG. 3, for example. As noted above, the grooves 132 may be formed either by removing material from the substrate 110, as indicated in FIG. 3, or by adding material to the substrate 110 on either side of the grooves, as indicated in FIG. 10. As shown, for example, in FIG. 13, each groove 132 extends at least partially along the outer surface 112 of the substrate 110 and has a base 134. As indicated in FIGS. 9, 13 and 14, the component 100 further includes a permanent filler 33 disposed within and extending across a top 136 of each of the one or more grooves 132 and a coating 150 disposed over at least a portion of the substrate 110 and over the permanent filler 33. For certain configurations, the permanent filler 33 further extends over at least a portion of the outer substrate surface 112. As indicated in FIG. 9, the groove(s) 132 and the permanent filler 33 and/or coating 150 together define one or more channels 130 for cooling the component 100.

Example materials and deposition techniques for permanent filler 33 are provided above. For example configurations, the permanent filler 33 comprises at least one of tungsten, nickel, cobalt, molybdenum, chromium, aluminum, and alloys thereof. For the illustrated examples, the permanent filler 33 comprises a continuous layer, such that the groove(s) 132 and the permanent filler 33 together define the cooling channel(s) 130. For other configurations, the permanent filler 33 comprises a plurality of metal particles integrally connected to a surface 152 of the coating 150.

As shown in FIG. 9 and as described above, for example configurations, the inner surface 116 of the substrate 110 defines at least one hollow, interior space 114, and one or more access holes 140 extend through the base 134 of a respective one of the groove(s) 132 to place the groove 132 in fluid communication with the respective hollow interior space 114.

As discussed above, the grooves need not be rectangular but rather may take a number of shapes, depending on the requirement for the specific application. For particular configurations, the grooves may be re-entrant shaped, as indicated in FIG. 16, for example. For this configuration, the permanent filler 33 extends across the top of the re-entrant shaped groove, such that the coating bridges the groove.

Beneficially, the use of a permanent filler 33 simplifies the material removal process for the filler and provides a robust permanent layer to support the coating 150 during its deposition.

Another component fabrication method is described with reference to FIGS. 3, 4, 9, 10 and 15-18. As indicated, for example, in FIGS. 3 and 10, this method of fabricating a component 100 includes forming one or more grooves 132 in an outer surface 112 of a substrate 110. Each groove 132 has a base 134 and a top 136 and extends at least partially along the outer surface 112 of the substrate 110. As noted above, the grooves 132 may be formed either by removing material from the substrate 110, as indicated in FIG. 3, or by adding material to the substrate 110 on either side of the grooves, as indicated in FIG. 10. This step is described in more detail above with reference to FIGS. 3 and 10. As indicated in FIG. 15, this component fabrication method further includes disposing a filler 33 within the one or more grooves 132, such that a gap 37 (for example, an air gap) is formed between the filler 33 and the base 134 of the respective groove 132. As indicated, for example in FIG. 9, this component fabrication method further includes disposing a coating 150 over at least a portion of the substrate 110 and over the filler 33. Example coating materials and deposition techniques are provided above.

For some configurations of the method illustrated by FIGS. 9 and 15, the filler 33 forms a permanent layer 33 that is not removed from the channels 130, such that the gap 37 defines the respective cooling channel 130. For these configurations, the resulting component is shown in FIG. 9. In other words, for these configurations, the groove(s) 132 and the (permanent) filler 33 together define one or more channels 130 for cooling the component 100. For particular configurations, the (permanent) filler 33 comprises at least one of tungsten, nickel, cobalt, molybdenum, chromium, aluminum, and alloys thereof. For example, a metal foil may be pressed or rolled on the surface to just fill the upper portion of the grooves, but also give a well defined fill depth over the air gap. Beneficially, this configuration provides a robust, permanent layer 33 for supporting the coating 150 during its deposition, while eliminating the need for a potentially difficult and time consuming leaching process.

For other processes, such as those also illustrated by FIG. 15, the filler 33 comprises a sacrificial filler 33, and the component fabrication method further includes at least partially removing the filler 33 after disposing the coating 150, such that the coating 150 extends over the groove(s) 132, and the groove(s) 132 and the coating 150 together define one or more channels 130 for cooling the component 100. Example sacrificial fillers for use with this air-gap embodiment include copper wire, aluminum wire and copper ink. Suitable removal processes for these fillers include the application of concentrated nitric acid, 50% caustic soda and concentrated nitric acid, respectively.

As discussed above with reference to FIG. 4, the component fabrication method may further include forming one or more access holes 140 through the base 134 of a respective groove 132 to connect the respective groove 132 in fluid communication with the respective hollow interior space 114. As indicated in FIG. 15, the access holes 140 are typically formed prior to depositing the filler 33.

Similar to the methods described above, the grooves need not be rectangular but rather may take a number of shapes, depending on the requirement for the specific application. For particular configurations, the grooves may be re-entrant shaped, as indicated in FIGS. 16 and 17, for example. For this configuration, the filler 33 extends across the top of the re-entrant shaped groove 132, as indicated in FIG. 17, for example, such that the coating 150 bridges the groove 132, as shown in FIG. 18.

Another component fabrication method is described with reference to FIGS. 2-14. As indicated, for example, in FIGS. 3 and 10, the fabrication method includes forming one or more grooves 132 in an outer surface 112 of a substrate 110. As shown for example in FIGS. 13 and 14, each groove 132 has a base 134 and extends at least partially along the outer surface 112 of the substrate 110. The substrate, the grooves, and the formation of the grooves are described above. The grooves 132 may be formed either by removing material from the substrate 110, as indicated in FIG. 3 or by adding material to the substrate 110 on either side of the desired grooves, as indicated in FIG. 10.

As indicated, for example, in FIGS. 5 and 6, the component fabrication method further includes disposing a sacrificial filler 32 within the one or more grooves 132 and disposing a second filler 33 over the sacrificial filler 32 and over at least a portion of the outer surface 112 of the substrate 110. As indicated, for example, in FIGS. 7-9, the component fabrication method further includes disposing a coating 150 over the second filler 33, such that the coating extends above at least a portion of the substrate 110 and removing the first sacrificial filler 32 from the one or more grooves 132 and partially removing the second filler 33, to define one or more channels 130 for cooling the component 100.

Example filler materials and removal techniques are described above. For particular processes, the sacrificial filler 32 comprises at least one material selected from the group consisting of wax, resin, metal alloy, graphite and combinations thereof, and the sacrificial filler 32 is removed by melting, evaporating, pyrolizing, leaching or oxidizing the sacrificial filler 32 out of the groove(s) 132. For particular processes, the second filler 33 comprises at least one metal or metal alloy, and the second filler 33 is partially removed by leaching.

Beneficially, the above-described methods provide improved means for depositing a coating over a grooved substrate to form a component with cooling channels. In particular, the above-described methods make it easier to provide a robust filler that can withstand the coating process. In addition, the methods that include the use of a sacrificial filler provide for easier removal of the sacrificial filler, while the methods that use only a permanent filler eliminate the need for a filler removal process. By simplifying (or eliminating) the removal process for the filler(s), these methods reduce the time and hence manufacturing costs for forming cooling channels within coated components.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of fabricating a component, the method comprising:
    forming one or more grooves in an outer surface of a substrate having at least one hollow interior space, wherein each of the one or more grooves has a continuous geometry defined by a base and a plurality of sidewalls, wherein each sidewall extends continuously from the base to an uppermost surface of the substrate and wherein each of the one or more grooves extends at least partially along the outer surface of the substrate;
    forming one or more access holes through the base of a respective one of the one or more grooves to connect the respective groove in fluid communication with the respective hollow interior space;
    disposing a sacrificial filler within the one or more grooves, the sacrificial filler in contact with the base and the plurality of sidewalls of each of the one or more grooves;
    disposing a permanent filler on an uppermost surface of the sacrificial filler, wherein the permanent filler is comprised of a structural material and in contact with only the uppermost surface of the sacrificial filler and the plurality of sidewalls of the one or more grooves and wherein the permanent filler is not in contact with the base of each of the one or more grooves;
    disposing a coating over at least a portion of the substrate and over the permanent filler; and
    removing the sacrificial filler from the one or more grooves, to define one or more channels for cooling the component.

2. The method of claim 1, wherein the one or more grooves are formed using one or more of an abrasive liquid jet, plunge electrochemical machining (ECM), electric discharge machining with a spinning electrode (milling EDM), and laser machining.

3. The method of claim 1, wherein the sacrificial filler comprises at least one material selected from the group consisting of wax, resin, metal alloy, graphite, and combinations thereof.

4. The method of claim 3, wherein the sacrificial filler comprises wax or resin and further comprises an electrically conductive particulate phase dispersed within the wax or resin, and wherein the permanent filler is deposited by electroplating or ion plasma deposition.

5. The method of claim 3, wherein the sacrificial filler is removed by melting, evaporating, pyrolizing, oxidizing or leaching the sacrificial filler out of the one or more grooves.

6. The method of claim 1, wherein the permanent filler comprises at least one of tungsten, nickel, cobalt, molybdenum, chromium, aluminum, and alloys thereof.

7. The method of claim 1, wherein a thickness of the permanent filler is less than about 500 microns.

8. The method of claim 1, wherein the permanent filler comprises an electrically conductive material, wherein the step of disposing the permanent filler over the sacrificial filler comprises at least partially covering the sacrificial filler with the electrically conductive material, and wherein the step of disposing the coating is performed by ion plasma deposition or electroplating.

9. The method of claim 8, wherein the electrically conductive material comprises an electrically conductive particulate phase.

10. The method of claim 1, wherein the sacrificial filler is disposed within the at least one or more grooves to a partial fill in a range of about 60-99.9 percent of the depth of the respective groove, and wherein the permanent filler is disposed within the at least one or more grooves to at least a full fill of the respective groove.

11. The method of claim 1, further comprising disposing at least one additional filler within the one or more grooves prior to disposing the permanent filler.

12. The method of claim 11, wherein the permanent filler comprises an electrically conductive material, wherein the step of disposing the permanent filler comprises at least partially covering the additional filler with the electrically conductive material, and wherein the step of disposing the coating is performed by ion plasma deposition.

13. The method of claim 1, wherein the step of disposing the permanent filler further comprises disposing the permanent filler over at least a portion of the outer surface of the substrate.

14. A method of fabricating a component, the method comprising:
    forming one or more grooves in an outer surface of a substrate having at least one hollow interior space, wherein each of the one or more grooves has a continuous geometry defined by a base and a plurality of sidewalls, wherein each sidewall extends continuously from the base to an uppermost surface of the substrate and wherein each of the one or more grooves extends at least partially along the outer surface of the substrate;
    disposing a filler within the one or more grooves, such that a gap is formed between the filler and the base of the respective groove, wherein the filler is comprised of a structural material and in contact with only the plurality of sidewalls of the one or more grooves;
    forming one or more access holes through the base of a respective one of the one or more grooves to connect the respective groove in fluid communication with the respective hollow interior space; and
    disposing a coating over at least a portion of the substrate and over the filler.

15. The method of claim 14, wherein the one or more grooves and the filler together define one or more channels for cooling the component.

16. The method of claim 14, wherein the filler comprises at least one of tungsten, nickel, cobalt, molybdenum, chromium, aluminum, and alloys thereof.

17. The method of claim 14, wherein the filler further comprises a sacrificial filler, the method further comprising at least partially removing the sacrificial filler after disposing the coating, such that the coating extends over the one or more grooves, and the one or more grooves and the coating together define one or more channels for cooling the component.

18. The method of claim 17, wherein the sacrificial filler comprises a material selected from the group consisting of a copper wire, an aluminum wire and a copper ink.

19. A method of fabricating a component, the method comprising:
   forming one or more grooves in an outer surface of a substrate, wherein each of the one or more grooves has a continuous geometry defined by a base and a plurality of sidewalls, wherein each sidewall extends continuously from the base to an uppermost surface of the substrate and wherein each of the one or more grooves extends at least partially along the outer surface of the substrate;
   disposing a sacrificial filler within the one or more grooves, the sacrificial filler in contact with the base and the plurality of sidewalls of each of the one or more grooves;
   disposing a second filler over the sacrificial filler and over at least a portion of the outer surface of the substrate, wherein the second filler is comprised of a structural material and in contact with only the uppermost surface of the sacrificial filler, the plurality of sidewalls of the one or more grooves and an outer surface of the substrate and wherein the second filler is not in contact with the base of each of the one or more grooves;
   disposing a coating over the second filler, such that the coating extends above at least a portion of the substrate; and
   removing the sacrificial filler from the one or more grooves and partially removing the second filler, to define one or more channels for cooling the component.

20. The method of claim 19, wherein the sacrificial filler comprises at least one material selected from the group consisting of wax, resin, metal alloy, graphite and combinations thereof, and wherein the sacrificial filler is removed by melting, evaporating, pyrolizing, leaching or oxidizing the sacrificial filler out of the one or more grooves.

21. The method of claim 20, wherein the second filler comprises at least one metal or metal alloy, and wherein the second filler is partially removed by leaching.

* * * * *

UNITED STATES PATENT AND TRADEMARK OFFICE
CERTIFICATE OF CORRECTION

PATENT NO. : 8,601,691 B2
APPLICATION NO. : 13/095129
DATED : December 10, 2013
INVENTOR(S) : Rebak et al.

It is certified that error appears in the above-identified patent and that said Letters Patent is hereby corrected as shown below:

Specification

In Column 3, Line 9, delete "FIG. 16-18" and insert -- FIGS. 16-18 --, therefor.

In Column 6, Line 25, delete "know" and insert -- known --, therefor.

In Column 6, Line 46, delete "(miffing" and insert -- (milling --, therefor.

In Column 6, Line 47, delete "drilling) Example" and insert -- drilling). Example --, therefor.

In Column 7, Line 19, delete "on or" and insert -- one or --, therefor.

In Column 7, Lines 21-22, delete "drilling The" and insert -- drilling. The --, therefor.

In Column 9, Line 62, delete "availably" and insert -- available --, therefor.

Signed and Sealed this
Twenty-fourth Day of November, 2015

Michelle K. Lee
*Director of the United States Patent and Trademark Office*